_United States Patent_ [19]

Ai et al.

[11] Patent Number: 4,756,989

[45] Date of Patent: Jul. 12, 1988

[54] IMAGE-FORMING MATERIALS SENSITIVE TO HIGH-ENERGY BEAM

[75] Inventors: Hideo Ai; Nobuo Nakazaki; Manabu Miyao, all of Fuji, Japan

[73] Assignee: Asahi Kasei Kogyo Kabushiki Kaisha, Osaka, Japan

[21] Appl. No.: 753,626

[22] Filed: Jul. 10, 1985

[30] Foreign Application Priority Data

Jul. 11, 1984 [JP] Japan ................... 59-142233
Jul. 24, 1984 [JP] Japan ................... 59-153372
Dec. 18, 1984 [JP] Japan ................... 59-265272
Dec. 18, 1984 [JP] Japan ................... 59-265273
Dec. 18, 1984 [JP] Japan ................... 59-265274
May 10, 1985 [JP] Japan ................... 60-99082

[51] Int. Cl.$^4$ .................. G03C 1/94; G03C 1/76; C08F 8/08; C08F 8/34
[52] U.S. Cl. ...................... 430/272; 430/278; 430/280; 430/296; 522/148; 522/150; 522/151; 522/152; 522/153; 525/332.2; 525/273; 525/326.2; 525/326.5; 525/326.7; 525/327.3; 526/256; 526/257; 526/243; 526/245; 526/250; 526/253; 526/255
[58] Field of Search ............... 430/280, 272, 278, 296; 525/332.2, 273, 326.2, 326.5, 326.7, 327.3; 522/148, 150, 151, 152, 153; 526/256, 257, 243, 245, 250, 253, 255

[56] References Cited

U.S. PATENT DOCUMENTS 2,807,599 9/1957 Burk et al. .................. 525/327.3
3,916,035 10/1975 Brewer .................... 430/296
4,285,788 8/1981 Eranian et al. ............. 525/327.3 X
4,528,332 7/1985 Ai et al. ................... 522/151 X

FOREIGN PATENT DOCUMENTS 64336 6/1981 Japan .
149012 11/1981 Japan .
124907 7/1984 Japan ................. 525/332.2
1100153 1/1968 United Kingdom ....... 525/327.3

OTHER PUBLICATIONS

Bartelt et al., "J. Electrochem. Soc., vol. 122, No. 4, pp. 541–544, (1975).
Polymer Preprints, Japan, vol. 29, No. 2, p. 215.
Crivello, Advance in Polymer Science 62, pp. 1–2.

_Primary Examiner_—Paul R. Michl
_Assistant Examiner_—Cynthia Hamilton
_Attorney, Agent, or Firm_—Birch, Stewart, Kolasch & Birch

[57] ABSTRACT

Disclosed is an image-forming material having a high sensitivity to high-energy beams and excellent in dry etching resistance, heat stability and resolution which comprises a copolymer containing a total of 1 to 99 mole-% of at least one of recurring structural units represented by the following formulas [A] and [A'] and 1 to 99 mole-% of at least one recurring structural unit represented by the following formula [B] and having a number-average molecular weight of 500 to 1,000,000:

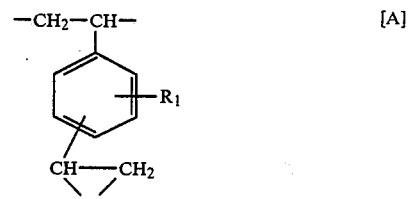

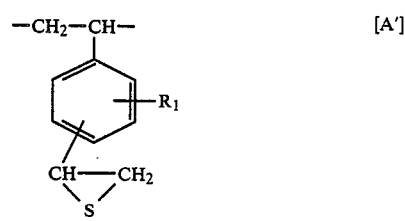

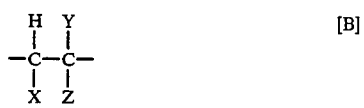

wherein $R_1$ of the formulas [A] and [A'] represents a hydrogen or halogen atom, or an alkyl group having 1 to 6 carbon atoms, the substituent groups $R_1$, epoxy group, and thiiranyl group being attached to the position ortho, meta, or para to the carbon atom in the main chain; X, Y, and Z of the formula [B] represent each a hydrogen atom, halogen atom, cyano group, alkyl group having 1 to 6 carbon atoms, halogenated alkyl group having 1 to 6 carbon atoms, aryl group having 6 to 30 carbon atoms and bearing a substituent alkyl or halogenated alkyl group having 1 to 6 carbon atoms, aryl group having 6 to 30 carbon atoms, —COOR$_2$, —COR$_2$, —O—COR$_2$ (wherein $R_2$ represents an alkyl or halogenated alkyl group having 1 to 12 carbon atoms, aryl group having 6 to 30 carbon atoms and bearing a substituent alkyl or halogenated alkyl group having 1 to 6 carbon atoms, or aryl group having 6 to 30 carbon atoms), nitro group, substituent group containing a hetero ring bearing substituent $R_3$ ($R_3$ represents a hydrogen atom, hydroxyl group, carboxyl group, halogen atom, nitro group, amino group, cyano group, alkyl or halogenated alkyl group having 1 to 6 carbon atoms, or aryl group having 6 to 30 carbon atoms), or substituent group containing a silicon atom. An image forming method using this material and an image-forming element are also disclosed.

32 Claims, No Drawings

IMAGE-FORMING MATERIALS SENSITIVE TO HIGH-ENERGY BEAM

This invention relates to an image-forming material sensitive to a high-energy beam, an image-forming element and a method for the image formation. More particularly, it relates to a novel material, element and a method for the image formation suitable for fabrication of micro devices such as semiconductor elements, integrated circuits, and the like.

Conventional materials sensitive to high-energy beams have been widely utilized in making printing plates, UV inks, and photocurable paints. In recent years, remarkable progress has been shown in the field of resist materials used in the formation of micropatterns. With the increase in packing density of integrated circuits (IC) and large scale integrations (LSI), there is a growing demand for the material capable of forming finer micropatterns.

The image-forming materials are classified into the positive resists which are degraded upon exposure to a high-energy beam, the degraded portions being removed by development, and the negative resists which are insolubilized upon exposure by crosslinking or the like, the unexposed portions being removed during development.

In fabrication of a circuit such as LSI, a resist is coated on a substrate, the coated substrate is exposed to a high-energy beam, then is developed to form a pattern, and the substrate is subjected to etching treatment. In fabrication of LSI and other circuits, the general trend at present is toward dry etching. The performance characteristics required for the resist materials, therefore, include high sensitivity, high resolution, high resistance to dry etching, thermal resistance, and adhesiveness.

The development of improved image-forming materials has been in active progress and various types have been proposed, including those having an epoxy group as the high-energy beam sensitive group. For instance, J. L. Bartelt and E. D. Feit reported in Journal of Electrochemical Society, Vol. 122, p. 541 (1975) that polyglycidyl methacrylate, epoxidized polyisoprene, and epoxidized polybutadiene have an extremely high sensitivity as a negative-type electron beam resist. The glycidyl methacrylate-ethyl acrylate copolymer and polyglycidyl methacrylate have already been marketed. Further, H. Egawa et al. proposed polyepithiopropyl methacrylate for the same purpose (Polymer Preprints, Japan, Vol. 29 (2), p. 215). Although high in sensitivity, these known substances are not entirely satisfactory in resolution and dry etching resistance. Japanese patent Unexamined publication (Kokai) No. 64,336/81 disclosed that an epoxidized diallyl o-phthalate polymer has an improved resistance to dry etching and that the improvement is ascribable to the benzene ring existing in the side chain. However, no known material is satisfactory in sensitivity, resolution, dry etching resistance, or thermal resistance.

Under the above-said technical circumstances, the present inventors carried out an extensive study and, as a result, discovered a novel image-forming material having a sensitivity, dry etching resistance, and resolution higher than those of the conventional materials, as well as a method for the image formation by using said novel material.

According to the present invention, there is provided an image-forming material sensitive to highenergy beams, comprising a copolymer [hereinafter referred to as copolymer (I)] containing a total of 1 to 99 mole-% of at least one of recurring structural units represented by the following formulas [A] and [A'] and 1 to 99 mole-% of at least one recurring structural unit represented by the following formula [B] and having a number-average molecular weight of 500 to 1,000,000:

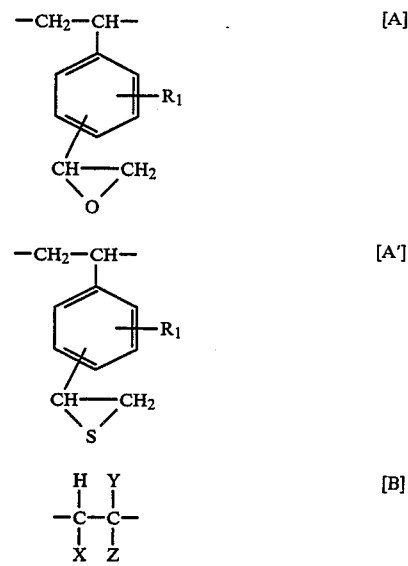

wherein $R_1$ of the formulas [A] and [A'] represents a hydrogen atom, halogen atom, or an alkyl group having 1 to 6 carbon atoms, the substituent groups $R_1$, epoxy group, and thiiranyl group being attached to the position ortho, meta, or para to the carbon atom in the main chain; X, Y and Z of the formula [B] represent each a hydrogen atom, halogen atom, cyano group, alkyl group having 1 to 6 carbon atoms, halogenated alkyl group having 1 to 6 carbon atoms, aryl group having 6 to 30 carbon atoms and bearing a substituent alkyl or halogenated alkyl group having 1 to 6 carbon atoms, aryl group having 6 to 30 carbon atoms, —$COOR_2$, —$COR_2$, —O—$COR_2$ (wherein $R_2$ represents an alkyl or halogenated alkyl group having 1 to 12 carbon atoms, aryl group having 6 to 30 carbon atoms and bearing an alkyl or halogenated alkyl group having 1 to 6 carbon atoms, or aryl group having 6 to 30 carbon atoms), nitro group, substituent group containing a heteroring bearing substituent $R_3$ (which represents a hydrogen atom, hydroxyl group, carboxyl group, halogen atom, nitro group, amino group, cyano group, alkyl or halogenated alkyl group having 1 to 6 carbon atoms, or aryl group having 6 to 30 carbon atoms), or substituent group containing a silicon atom.

The atoms and groups represented by $R_1$ of the formulas [A] and [A'] include hydrogen, alkyl groups of 1 to 6 carbon atoms such as methyl, ethyl, propyl, butyl, pentyl, hexyl, and 2-methylbutyl groups, and halogens such as fluorine, chlorine, bromine, and iodine. Of these atoms and groups most-preferred is hydrogen in view of the dry etching resistance.

Although the substituent groups $R_1$, epoxy, and thiiranyl in the formulas [A] and [A'] can be attached to any of the positions ortho, meta, and para with respect to the carbon atom of main chain, the meta or para position is preferred in view of the sensitivity.

As examples of atoms and groups represented by X, Y, and Z in the recurring unit represented by the formula [B], mention may be made of hydrogen, cyano group, halogens such as fluorine, chlorine, bromine, and iodine; alkyl groups of 1 to 6 carbon atoms such as methyl, ethyl, propyl, butyl, pentyl, hexyl, isopropyl, isobutyl, sec-butyl, tert-butyl, neopentyl, tert-pentyl, and isohexyl; halogenated alkyl groups of 1 to 6 carbon atoms such as chloromethyl, trichloromethyl, trifluoromethyl, 1,1,1-trichloroethyl, 1-trifluoromethylpentyl, 2,2,2trifluoroethyl, trifluoroisopropyl, hexafluorobutyl, and heptafluorobutyl. As examples of substituted aryl groups (i.e. aryl groups having 6 to 30 carbon atoms and bearing a substituent alkyl or halogenated alkyl group having 1 to 6 carbon atoms), mention may be made of substituted phenyl, substituted indenyl, substituted naphthyl, substituted azulenyl, substituted heptalenyl, substituted biphenylenyl, substituted as-indacenyl, substituted sindacenyl, substituted acenaphthenyl, substituted fluorenyl, substituted phenanthryl, substituted anthryl, substituted fluoranthryl, substituted aceanthrylenyl, substituted triphenylenyl, substituted pyrenyl, substituted chrysenyl, substituted naphthacenyl, substituted picenyl, substituted perylenyl, substituted pentaphenyl, substituted pentacenyl, substituted tetraphenylenyl, substituted hexaphenyl, substituted rubicenyl, substituted coronenyl, substituted trinaphthylenyl, substituted heptaphenyl, substituted heptacenyl, and substituted pyranthrenyl. The substituent alkyl groups of 1 to 6 carbon atoms are similar to the aforementioned alkyl groups. Examples of substituted phenyl groups are 4-methylphenyl group and 3-ethylphenyl group. The substituent halogenated alkyl groups are similar to the aforementioned halogenated alkyl groups. A typical example of substituted phenyl groups is 4-chloromethylphenyl group. Examples of aryl groups of 6 to 30 carbon atoms include phenyl, indenyl, naphthyl, azulenyl, heptalenyl, biphenylenyl, as-indacenyl, s-indacenyl, acenaphthenyl, fluorenyl, phenanthryl, anthryl, fluoranthryl, aceanthrylenyl, triphenylenyl, pyrenyl, chrysenyl, naphthacenyl, picenyl, perylenyl, pentaphenyl, pentacenyl, tetraphenylenyl, hexaphenyl, rubicenyl, coronenyl, trinaphthylenyl, heptaphenyl, heptacenyl, and pyranthrenyl.

Examples of R$_2$ (which represents an alkyl or halogenated alkyl group having 1 to 12 carbon atoms, an aryl group having 6 to 30 carbon atoms and bearing a substituent alkyl or halogenated alkyl group having 1 to 6 carbon atoms, or an aryl group having 6 to 30 carbon atoms) in the groups —COOR$_2$, —COR$_2$, and —O—COR$_2$ are similar to those of alkyl or halogenated alkyl groups, substituted aryl groups, and aryl groups described above. Examples of groups —COOR$_2$, —COR$_2$, and —O—COR$_2$ include —COOCH$_3$, —COOC$_2$H$_5$, —COOCCl$_3$, —COOCH$_2$.CCl$_3$, —COOCHF.CHF.CHFCF$_3$, —COOC$_6$H$_7$, —COOC$_{10}$H$_5$, —COCH$_3$, —COCF$_3$, —COC$_6$H$_5$, —O—COCH$_3$, —O—COCCl$_3$, —O—COCF$_3$, —O—COC$_6$H$_5$, —O—COC$_{10}$H$_7$, —O—COC$_4$H$_9$, and —O—COC$_6$H$_{13}$.

As examples of substituents groups containing a hetero ring ring bearing substituent R$_3$, mention may be made of the following structural formula ① to ㉛:

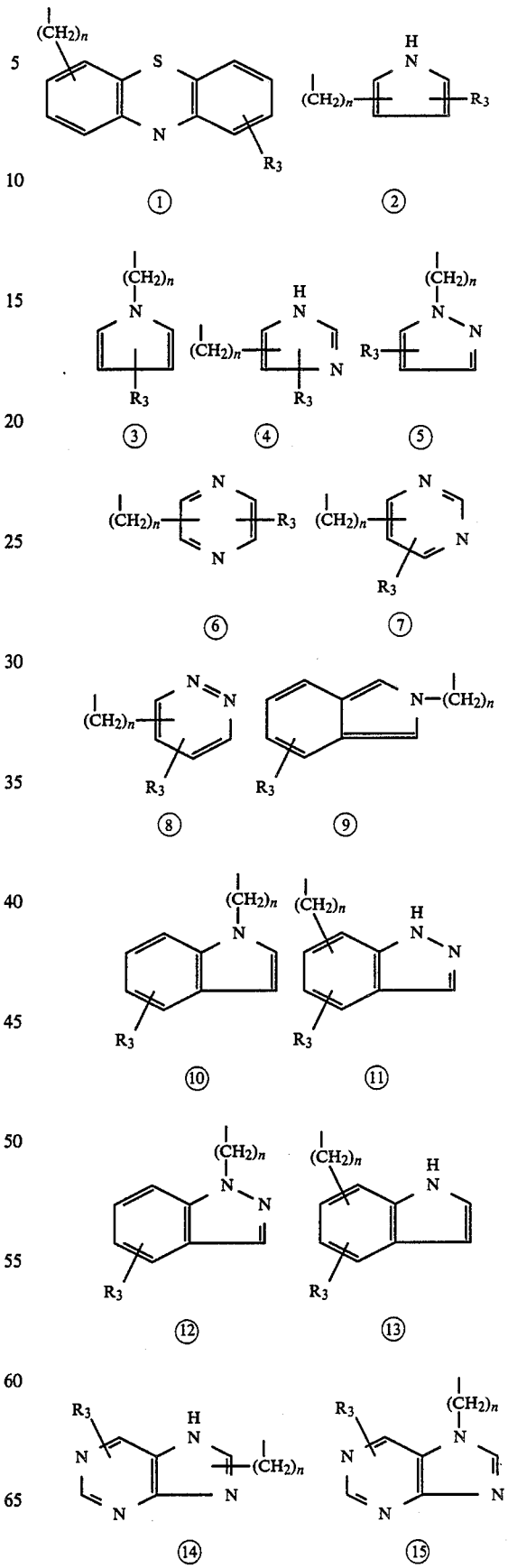

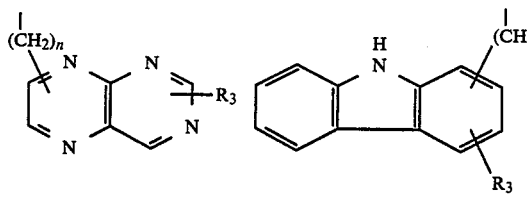 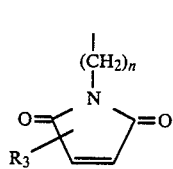

⑯  ⑰

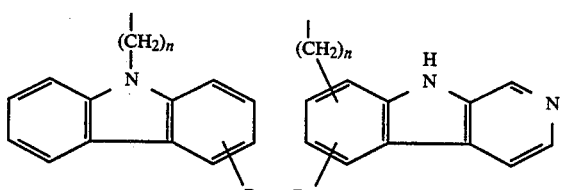

⑱  ⑲

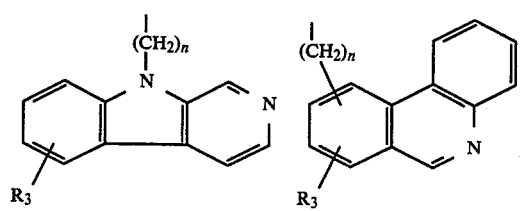

⑳  ㉑

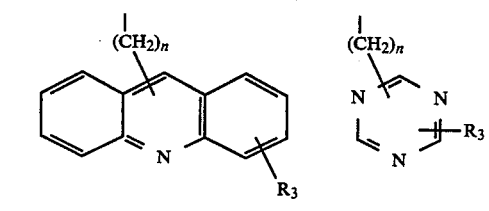

㉒  ㉓

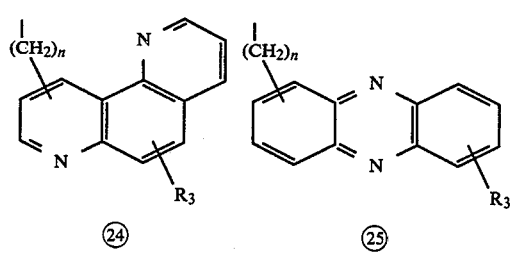

㉔  ㉕

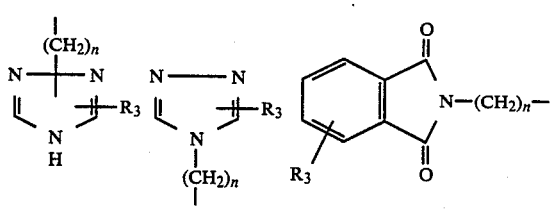

㉖  ㉗  ㉘

㉙  ㉚  ㉛

In the above formulas, n represents 0 or 1, $R_3$ represents a hygrogen atom, hydroxyl group, carboxyl group, a halogen atom, nitro group, amino group, cyano group, an alkyl or halogenated alkyl group having 1 to 6 carbon atoms or aryl group having 6 to 30 carbon atoms.

As examples of substituent groups containing a silicon atom, mention may be made of groups of the following formulas ㉜ to ㊻:

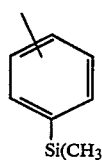 ㉜

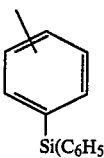 ㉝

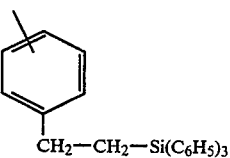 ㉞

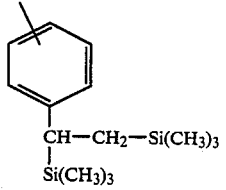 ㉟

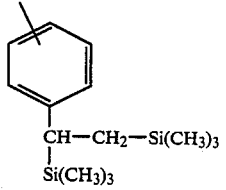 ㊱

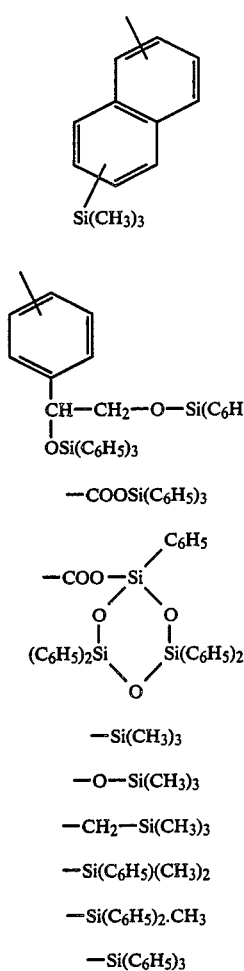

(37)

(38)

—COOSi(C₆H₅)₃  (39)

(40)

—Si(CH₃)₃  (41)
—O—Si(CH₃)₃  (42)
—CH₂—Si(CH₃)₃  (43)
—Si(C₆H₅)(CH₃)₂  (44)
—Si(C₆H₅)₂·CH₃  (45)
—Si(C₆H₅)₃  (46)

Regarding the compounds with substituent groups containing a silicon atom, there are published a number of books such as, for example, C. Eaborn, "Organosilicone Compounds." (published by Butterworths Scientific Publications, 1960) and M. Kumada et al., "Chemistry of Organosilicone Compounds.", (published by Kagaku Dojin Co., 1972). Detailed description of the method of synthesis and the physical and chemical properties will be found in these books.

Of the nonlimitative examples of substituent groups, the following ones, in addition to the methyl group, are preferred in view of sensitivity, dry etching resistance, and availability of starting materials:

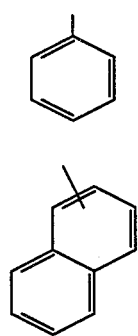

-continued

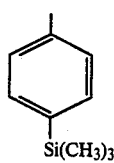

(32)

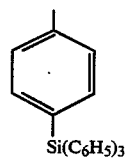

—Si(C₆H₅)(CH₃)₂  (44)

—Si(C₆H₅)₂·CH₃  (45)

—Si(C₆H₅)₃  (46)

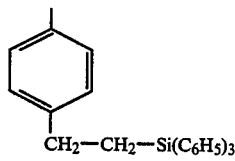  (35)

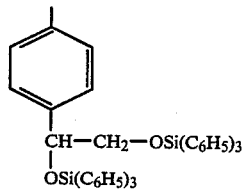  (38)

Particular desirable combinations of substituent groups in the recurring unit represented by the formula [B] are shown hereunder in the form of (H, X, Y, Z):

| | | |
|---|---|---|
| (H, H, H, ㊼ ) | (H, H, H, ㊽ ) | (H, H, H, ㊾ ) |
| (H, H, H, ㊿ ) | (H, H, H, �containing51 ) | (H, H, H, ㊷ ) |
| (H, H, H, ③) | (H, H, H, ⑨) | (H, H, H, ⑩ ) |
| (H, H, H, ⑱ ) | (H, H, H, ㉒ ) | (H, H, H, ㉝ ) |
| (H, H, H, ㉟ ) | (H, H, H, ㊳ ) | (H, H, H, ㊹ ) |
| (H, H, H, ㊽ ) | (H, H, H, ㊻ ) | |
| (H, H, ㊽ , ㊼ ) | (H, H, —CH₃, ㊼ ) | (H, H, ㊼ , ㊼ ) |
| (H, H, CH₃, ⑱ ) | (H, H, ㊼ , ㊿ ) | (H, H, CH₃, ㊷ ) |
| (H, H, ㊼ , ㊷ ) | (H, H, CH₃, ㊹ ) | (H, H, ㊼ , ㊳ ) |
| (H, CH₃, H, ㊼ ) | (H, ㊼ , H, ㊼ ) | (H, ㊽ , H, ㊼ ) |
| (H, ㊾ , H, ㊼ ) | (H, ㊼ , H, ㊿ ) | (H, ㊽ , H, ㊿ ) |
| (H, ㊼ , H, ㊿ ) | (H, ㊼ , CH₃, ㊼ ) | |
| (H, ㊽ , CH₃, ㊼ ) | (H, ㊼ , ㊼ , ㊼ ) | |
| (H, ㊽ , ㊼ , ㊼ ) | | |

The recurring unit represented by the formula [B] is not necessarily one and the same, but can be a combination of two or more different units in a suitable ratio to improve the overall performance of the image-forming material. For instance, when at least one of X, Y, and Z is a halogen atom, cyano group, —COOR₂, —COR₂, and O—COR₂ (R₂ represents an alkyl or halogenated alkyl group having 1 to 12 carbon atoms, aryl group having 6 to 30 carbon atoms and bearing a substituent alkyl or halogenated alkyl group having 1 to 6 carbon atoms, or aryl group having 6 to 30 carbon atoms), the impact resistance of the coating layer as well as the adhesion of the coating layer to the substrate are simultaneously improved. Therefore, when the adhesion to the substrate is specifically required, it is desirable to introduce the said substituents. When the recurring unit represented by the formula [B] is

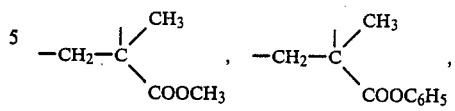 (5)

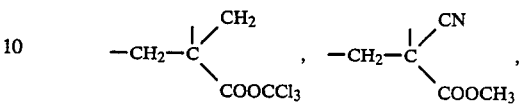 (10)

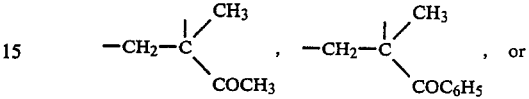 , or (15)

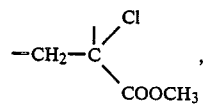 , (20)

there is produced a positive-type image-forming material of high sensitivity.

The proportions of the sum of recurring units represented by [A] and [A'] and that of recurring unit [B] in the copolymer (I) are generally from 1 to 99 mole-%, preferably from 5 to 95 mole-% in view of sensitivity, most preferably from 10 to 90 mole-% in view of both resolution and dry etching resistance. The proportions of each of [A] and [A'] in the copolymer (I) are subject to the restriction imposed by the following relations:

$$1 \leq M_A + M_{A'} \leq 99$$

$$0 \leq M_A \leq 99$$

$$0 \leq M_{A'} \leq 99$$

wherein $M_A$ and $M_{A'}$ represent mole-% of [A] and [A'], respectively. $M_A$ and $M_{A'}$ are suitably selected with due regard to the energy characteristics of the high-energy beam being used.

The number-average molecular weight of the copolymer (I) is generally from 500 to 1,000,000, preferably 3,000 to 1,000,000, more preferably from 3,000 to 500,000 in view of sensitivity and resolution.

A common method for producing the copolymer (I) bearing an epoxy group (referred to as copolymer $I_E$ hereinafter) is described hereunder.

A highly random copolymer ($I_E$) is produced by copolymerizing, in the presence of a polymerization initiator, the monomers represented by the formulas (a) and (b)

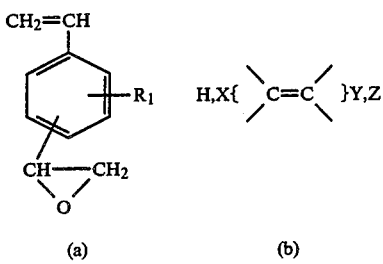

(a)  (b)

wherein $R_1$, X, Y and Z are as defined above.

As examples of monomers represented by the formula (b), there may be mentioned styrene, 1-vinylnaphthalene, 2-vinylnaphthalene, 1-vinylanthracene, 2-vinylanthracene, 9-vinylanthracene, 2-vinylphenanthrene, 3-vinylphenanthrene, 3-chloromethylstyrene, 4-chloromethylstyrene, 3-fluoromethylstyrene, 4-fluoromethylstyrene, N-vinylpyrrole, N-vinylisoindole, N-vinylindole, N-vinylcarbazole, 3-vinylphenathridine, 2-vinylacridine, 4-trimethylsilylstyrene, 4-triphenylsilylstyrene, dimethylphenylvinylsilane, diphenylmethylvinylsilane, triphenylvinylsilane, 4-(2-triphenylsilylethyl)styrene, 4-(1,2-ditriphenylsilyloxyethyl)styrene, 1,1-diphenylethylene, 1-(2-naphthyl)-1-phenylethylene, 1-(1naphthyl) -1-naphthyl)-1-phenylethylene, 1-methyl-1-phenylethylene, 1-(9-carbazolyl)-1-phenylethylene, 1-(9-carbazolyl)-1-methylethylene, 1-(1-indolyl)-1-phenylethylene, 1-methyl-(4-triphenylsilylphenyl)ethylene, 1-phenyl-(4-triphenylsilylsilylphenyl)ethylene, 2-methyl-1phenylethylene, 1,2-diphenylethylene, 2-(2-naphthyl)-1-phenylethylene, 2-(1-naphthyl)-1-phenylethylene, 2-(9-anthracenyl)-1-phenylethylene, 1-(2-phenanthryl)-2-phenyl-ethylene, 2-(1-naphthyl)-1-(2-phenanthryl)-ethylene, 1,2-diphenyl-2-methylethylene, 2-(1-naphthyl)-1-methyl-1-phenylethylene, 1,1,2-triphenylethylene, and 2-(2-naphthyl)-1,1-diphenylethylene.

The copolymerization can be carried out in the presence or absence of a reaction medium, but preferably in the presence of a medium to facilitate the control of copolymerization. Suitable media include ethers such as diethyl ether, methyl ethyl ether, dibutyl ether, tetrahydrofuran, and tetrahydropyrane; aromatic hydrocarbons such as benzene, toluene, xylene, and ethylbenzene, aliphatic hydrocarbons such as pentane, hexane, heptane, and cyclohexane; and mixtures thereof. The selection of these media should be done with due regard to the physical and chemical properties, particularly molecular weight, of the intended copolymer and the physical properties such as chain transfer constant of the medium.

The copolymer ($I_E$) can also be obtained by emulsion or suspension polymerization using an aqueous medium containing an emulsifier or dispersant. In this case a copolymer of higher molecular weight is obtained. As examples of emulsifiers which can be used, mention may be made of anionic surface active agents such as fatty acid salts, higher alcohol sulfate ester salts, and alkylarylsulfonate salts; cationic surface active agents such as amine salts or ammonium salts; and nonionic surface active agents such as polyoxyethylene alkyl ethers, polyoxyethylene alkyl esters, sorbitan alkyl esters, and polyoxyethylene sorbitan alkyl esters. Examples of dispersants are completely saponified polyvinyl alcohol, polyacrylic acid, and ammonium oleate. Suitable emulsifier or dispersant is selected according to the monomers which are employed. The amount to be used of the emulsifier or dispersant should be determined by taking the nature of monomers, and of emulsifier or dispersant, with due regard to the stability of polymerization.

The polymerization initiator can be freely selected from organic peroxides such as benzoyl peroxide, lauroyl peroxide, cumene hydroperoxide, tert-butyl hydroperoxide, and dicumyl peroxide; persulfates, and azo compounds such as co-azobisisobutyronitrile; and mixtures thereof. However, organic peroxides and azo compounds are generally preferred in view of the stability of the products and control of the copolymerization.

The amount used of the initiator is not restricted, but can be determined depending upon the molecular weight of the intended copolymer ($I_E$). The temperature and time of copolymerization are also not restricted, but should be determined by taking the activation energy of decomposition of the initiator into account. The general ranges of temperature and time are from $-10°$ C. to $120°$ C. and 0.5 minute to 72 hours, respectively.

The copolymer ($I_E$) of this invention is also obtained by treating with an oxidizing agent a copolymer [hereinafter referred to as copolymer (II)] comprising recurring units represented by the formulas

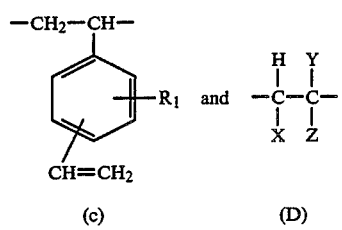

(c)  (D)

wherein $R_1$, X, Y and Z are as defined above. The copolymer (II) is obtained by the anionic copolymerization of divinylbenzene and the aforementioned monomer as described, for example, in Japanese patent application No. 240,729/83. The copolymer obtained by treating with an oxidizing agent includes predominantly a block copolymer. The oxidizing agent is not specific, but can be selected from aliphatic and aromatic peracids including perbenzoic acid, substituted perbenzoic acids such as m-chloroperbenzoic acid, p-methoxycarbonylperbenzoic acid, and o-sulfoperbenzoic acid; peracetic acid, substituted peracetic acids such as trifluoromethylperacetic acid, performic acid, perpropionic acid, monoperfumaric acid, monoperphthalic acid, and percarboxylated polystyrene; mixtures of hydrogen peroxide and carboxylic acids such as formic acid, acetic acid, and maleic anhydride; mixtures of metal complexes such as vanadium acetylacetonate, iron acetylacetonate and molybdenum tetracarbonyl; and peroxides such as hydrogen peroxide and tert-butyl hydroperoxide. Of these compounds, particulary preferred are perbenzoic acid, substituted perbenzoic acids, percumic acid, and perpivalic acid.

The oxidation is carried out preferably in the presence of solvents such as halogenated hydrocarbons including chloroform, methylene chloride, and chloroethanes, ketones such as acetone and methyl ethyl ketone, ethers such as diethyl ether, dioxane, and diglyme, and esters such as ethyl acetate and methyl benzoate.

Although not limited, oxidizing agents are used in a molar ratios of 1.0 or more, preferably 1.1 or more, to the copolymer (II) in terms of double bond. The amount unsed of the solvent is 100 ml to 50 liters, preferably 500 ml to 10 liters for one mole of the oxidizing agent. The reaction temperature is −50° C. to 150° C., preferably −20° C. to 60° C. It is desirable to control the progress of reaction at a temperature in proximity to room temperature. Although it varies depending upon the types and amounts of oxidizing agent and solvent and the reaction temperature, the reaction time is generally 10 minutes to 72 hours, preferable 2 to 48 hours.

The acid formed as a by-product during the reaction is preferably neutralized with an alkali such as sodium hydroxide or sodium hydrogencarbonate or an aqueous alkali solution. The neutralization is performed by mixing the reaction mixture with an aqueous alkali solution or by dispersing powdered sodium carbonate or sodium hydrogencarbonate during the reaction. When a water-insoluble solvent is used in the reaction, the isolation of the product copolymer (I) is performed by washing the reaction mixture with an aqueous alkali solution, then with water, and removing the solvent by distillation. It is also possible to use column chromatography.

The preparation of copolymer (I) having a thiiranyl group (referred to as copolymer $I_S$ hereinafter) is described below.

The copolymer ($I_S$) having a thiiranyl group is obtained by copolymerizing, in the presence of a polymerization initiator, monomers represented by the formulas (c) and (d):

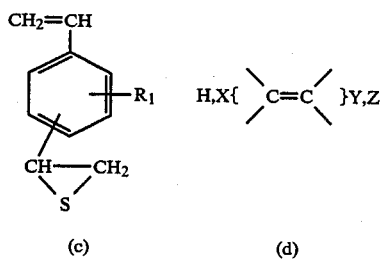

(c)         (d)

wherein $R_1$, X, Y and Z are as defined above. The copolymerization can be carried out in the presence or absence of a reaction medium, but preferably in the presence of a medium to facilitate the control of copolymerization. Suitable media include ethers such as diethyl ether, methyl ethyl ether, dibutyl ether, tetrahydrofuran, and tetrahydropyrane; aromatic hydrocarbons such as benzene, toluene, xylene, and ethylbenzene; aliphatic hydrocarbons such as pentane, hexane, heptane, and cyclohexane; and mixtures thereof. The selection from these media should be done with due regard to the physical properties, particularly molecular weight, of the intended copolymer and the properties such as chain transfer constant of the medium.

The polymerization initiator can be freely selected from organic peroxides such as benzoyl peroxide, lauroyl peroxide, cumene hydroperoxide, tertbutyl hydroperoxide, and dicumyl peroxide; persulfates, and azo compounds such as α,α'-azobisisobutyronitrile; and mixtures thereof. However, organic peroxides and azo compounds are generally preferred in view of the stability of the products and control of the copolymerization. The amount used of the initiator is not restricted, but can be determined depending upon the molecular weight of the intended copolymer ($I_S$). The amount used of the initiator is not restricted, but can be determined depending upon the molecular weight of the intended copolymer ($I_S$). The temperature and time of copolymerization are also not restricted, but should be determined by taking into account the activation energy of decomposition of the initiator. The general ranges of temperature and time are from -10° C. to 120° C. and from 0.5 minute to 72 hours, respectively.

The copolymer ($I_S$) having a thiiranyl group according to this invention can also be obtained by treating the aforementioned copolymer containing an epoxy group [hereinafter referred to as copolymer (III)] with a reagent capable of converting oxirane ring into thiirane ring (hereinafter referred to as thiiranizing agent). The thiiranizing agent used in this invention is not specific, but can be selected from potassium thiocyanate, ammonium thiocyanate, thiourea, 3-methylbenzothiazole-2-thione, triphenylphosphine sulfide, and the like. The reaction between the copolymer (III) and the thiiranizing agent is carried out preferably in a medium inert to the latter, such as alcohols, e.g. methanol and ethanol. It is desirable for the improvement of thiiranizing efficiency to add a solvent capable of dissolving the copolymer (III), such as toluene or ethylbenzene. The amount of thiiranizing agent markedly affect the efficiency of thiiranization and is preferably equivalent or more to the epoxy group in copolymer (III). The reaction temperature is generally 100° C. or below, preferably -20° to 30° C. to control the side reaction. The reaction time is generally 5 minutes to 72 hours, preferably 10 minutes or more in view of thiiranizing efficiency.

According to the present invention, there is further provided an image-forming element comprising a substrate and an image-forming material layer comprising the copolymer (I) coated on said substrate.

Furthermore, below is described a method of image formation by the use of a material comprising the copolymer (I), which forms a finer image than that formed by the conventional methods and the image which is formed is resistant to dry etching and heat.

The above object is achieved by coating a substrate with a coating composition containing the material comprising said copolymer (I) containing a total of 1 to 99 mole-% of at least one of recurring structural units represented by the following formulas [A] and [A'] and 1 to 99 mole-% of at least one recurring structural unit represented by the following formula [B] and having a number-average molecular weight of 500 to 1,000,000, then exposing the intended areas of the coating layer to a high-energy beam, and developing the exposed coating layer with a developer:

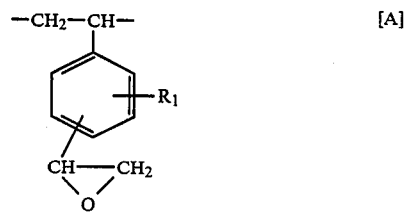

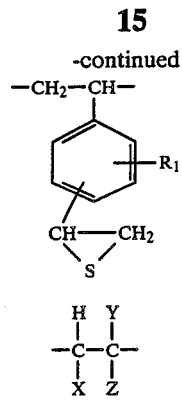

wherein $R_1$, X, Y and Z as defined above.

The solvent used in the coating composition can be any of those capable of dissolving the copolymer (I). As non-limitative Examples of the solvents, mention may be made of aromatic hydrocarbons such as benzene, toluene, and ethylbenzene; acetates such as ethyl acetate and npropyl acetate; ethers such as diethyl ether and tetrahydrofuran; glycol derivatives such as methyl Cellosolve, ethyl Cellosolve, and methyl Cellosolve acetate; ketones such as acetone, methyl ethyl ketone, and cyclohexanone; lactams such as N-methylpyrrolidone; halogenated hydrocarbons such as methylene chloride and chloroform; and mixtures thereof. The selection of solvent should be made by taking into account the molecular weight and composition of the copolymer (I) and wettability of the substrate.

A resist solution prepared by dissolving the copolymer (I) in the solvent is coated on a substrate and the coated substrate is heated to dry the coating layer. Such a procedure is recommendable to form a reproducible image. The temperature and duration of heating are determined by taking the volatility of the coating composition into account.

The high-energy beams used in this invention include ultraviolet rays, deep ultraviolet rays, γ-rays, X-rays, and electron beam, though not limited thereto. When combined with various photoionization polymerization initiators, the copolymer (I) becomes sensitive to radiations ranging from ultraviolet region to visible light of 600 nm in wavelength and capable of forming the image by exposing to these radiations. Such initiators are those compounds which form Lewis acids or Brönsted acids by the photoreaction. A large number of such compounds are known and diazonium salts, halogenium salts, sulfonium salts, and other onium salts are described in J. V. Crivello, "Advances in Polymer Science 62", pp 1-48 and some of the compounds are commercially available. As typical examples, mention may be made of 4-diazodiphenylamine sulfate, 4-diazo-4'-methoxydiphenylamine sulfate, 4-diazodiphenylamine hydrochloride, diphenyliodonium hexafluoroarsenate, bis(4-tert-butylphenyl)iodonium hexafluorophosphate, triphenylsulfonium hexafluoroarsenate, triphenylpyrylium perchlorate, 4-methoxyphenyl-2,6diphenylpyrylium perchlorate, triphenylthiopyrylium perchlorate, and triphenylthiopyrylium tetrafluoroborate. These compounds are used in an amount of 0.5 to 20 parts by weight for 100 parts by weight of the copolymer (I).

The developer usable in the image forming method of the present invention can be an organic solvent capable of dissolving the copolymer (I). Accordingly, the above-mentioned coating composition and mixtures thereof can be, in principle, a developer. It is desirable for the formation of an image with good resolution to add to the developer a poor solvent such as hexane, methanol, ethanol, isopropyl alcohol, ehylene glycol, Cellosolve, or the like in an amount of 0.5 to 80% by volume for the purpose of controlling the developing strength. The time of development is suitably determined by paying due consideration to various conditions such as molecular weight of the copolymer (I), type of the high-energy beam used as radiation source, and type of the developer. After development, the substrate is preferably washed with a rinse solution to ensure complete removal of residues from the superior image. The rinse solution is poor solvent for the copolymer (I) and is good solvent for the developer. As typical examples of the rinse solutions, mention may be made of alcohols such as methanol, ethanol, n-propyl alcohol, isopropyl alcohol, n-butyl alcohol, ethylene glycol, propylene glycol, ethyl Cellosolve, methyl Cellosolve, and butyl Cellosolve; aliphatic hydrocarbons such as pentane, hexane, and heptane; and mixtures thereof. After the washing, the residual rinse solution should be removed by drying at a temperature of 40° to 250° C., the time of drying being determined with due regard to boiling point and volatility of the rinse solution employed.

The invention is further illustrated in detail below with reference to Examples, but the invention is not limited therto. In Examples and Synthesis Examples, the following testing apparatuses and methods were employed.

Gel permeation chromatography (GPC):
  Chromatograph: Nippon Bunko Co.
  Pump: Twincle; column: A-803, A-804 in series.
    Used for the determination of number-average molecular weight. Calibration curve was plotted using standard polystyrene.
X-ray fluorescence analysis:
  Analyzer: Rigaku Denki Kogyo Co. 3064-M.
    Used for the determination of silicon. Calibration curve was plotted using triphenylbiphenylsilane.
Nuclear magnetic resonance spectroscopy (NMR):
  Spectroscope: JEOL, type JMR-GX400 FT-NMR (400 MHZ).

SYNTHESIS EXAMPLE 1-1

Synthesis of 4-vinylstyrene oxide.

Into a 1-liter reactor provided with a stirrer, and a thermometer, were added 25 g of p-divinylbenzene, 40 g of sodium hydrogencarbonate, and 400 ml of toluene. To the mixture, while being kept at 5° C. and stirred, was added dropwise a solution of 100 g (40% by weight) of m-chloroperbenzoic acid in toluene. The resulting mixture was stirred at 5° C. for 10 hours. After completion of the reaction, the reaction mixture was washed with aqueous sodium hydrogencarbonate solution, and dried over anhydrous magnesium sulfate. The mixture was filtered from the drying agent, then stripped of the toluene under reduced pressure, and purified by distillation to yield 65 g of 4-vinylstyrene oxide (1 Torr., 74° C.). In a similar manner, 3-vinylstyrene oxide was obtained from m-divinylbenzene.

SYNTHESIS EXAMPLE 2-1

Synthesis of 4-vinylstyrene episulfide.

Into a 1-liter flask provided with a stirrer and a thermometer, was added 300 ml of methanol followed by 100 g of 4-vinylstyrene oxide. To the mixture, while being kept at 5° to 10° C., was added gradually 35 g of thiourea. The mixture was stirred for 72 hours. After completion of the reaction, methanol was removed by distillation and the residue was washed with water to yield 60 g of 4-vinylstyrene episulfide. The proton nuclear magnetic resonance spectrum showed 4, 1, 1, 1, 1, and 2 protons at δ1 -values of 7.2–7.5, 6.65, 5.76, 5.20, 3.95–4.15, and 2.8–3.0, respectively.

SYNTHESIS EXAMPLE 2-2

Synthesis of 1-methyl-1,2-disphenylethylene (α-methyl-β-phenylstyrene)

Into a 1-liter autoclave, provided with a stirrer, were charged 10 mmol of c-methylstyrene, 1 mmol of palladium acetate, 10 mmol of triethylamine, 50 ml of acetonitrile, and 9.2 mmol of phenyl iodide. The mixture was stirred at 100° C. for 34 hours. After cooling, the reaction mixture was poured into 10% by weight of dilute hydrochloric acid. The mixture was filtered from insolubles, then removed of the solvent, and purified by passing through an alumina column. NMR spectrum of the product showed protons at δ-values 7.0–7.6 ppm

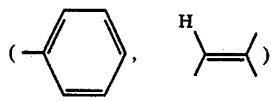

and 2.0 ppm. (—CH$_3$).

SYNTHESIS EXAMPLE 2-3

Into a 1-liter separable flask provided with a stirrer, thermometer, and reflux condenser and containing 400 ml of purified toluene, were added with stirring 50 g of the epoxy compound obtained in Synthesis Example 1—1 and 50 g of styrene. After the addition of 1.0 g of α,α′-azobisisobutyronitrile, the mixture was stirred at 75° C. for 8 hours under a nitrogen stream. After completion of the reaction, the reaction mixture was poured into a large volume of methanol and left standing overnight. A white precipitate was collected by filtration, washed with methanol, and dried at room temperature under reduced pressure to obtain 82 g of a copolymer having a numberaverage molecular weight of 23,000, as determined by GPC. The proton NMR spectrum showed that the copolymer contained 56 mole-% of an epoxy compound.

SYNTHESIS EXAMPLES 3 to 9

Copolymers as shown in Table 1 were obtained in a manner similar to that in Synthesis Example 2-3 using monomers shown in Table 1 in place of the styrene and under the conditions shown in Table 1.

SYNTHESIS EXAMPLE 10

Into a 2-liter flask provided with a stirrer, dropping funnel, and thermometer, which had been flushed with nitrogen, were added 500 ml of dried tetrahydrofuran and 200 g of diisopropylamine. After the mixture had been cooled down to 0° C., to the flask was added dropwise with stirring 190 ml of a 15-% solution of n-butyllithium in hexane. To the mixture, while being maintained at 0° C., was added 35 g of styrene followed by the continuous addition of a solution of 65 g of p-divinylbenzene in 200 ml of tetrahydrofuran at a rate of 30 ml/hour. The mixture was further stirred for 8 hours under a nitrogen stream. After addition of 30 ml of methanol, the reaction mixture was slowly added to a large volume of methanol. A white precipitate which was formed was collected by filtration, washed with water, and dried to yield 83 g of a white solid substance. This substance was readily soluble in acetone, ethyl acetate, toluene, chloroform, etc. and had a number-average molecular weight of 48,000, as determined by GPC. The NMR spectrum showed a broad absorption at δ values in the vicinity of 0.8–3.0 with a peak at 1.5, somewhat sharp-pointed absorption at 5.0–5.3 and 5.5–5.8, and a broad absorption band at 6.0–7.6 with peaks at 6.6 and 7.1. The relative intensity of absorption showed a divinylbenzene content of 87 mole-%.

Into a 100-ml reactor provided with a thermometer and stirrer, were added 26 g of the substance obtained above, 30 ml of methylene chloride, and 3.6 g of sodium hydrogencarbonate. To the mixture which had been cooled down to 5° C., was added dropwise with stirring a solution of 15 g of m.-chloroperbenzoic acid in 24 ml of methylene chloride. The reactant mixture was stirred at 5° C. for 24 hours. After confirming the disappearance of m-chloroperbenzoic acid with a potassium iodide-starch test-paper, the reaction mixture was washed three times with a saturated aqueous sodium hydrogencarbonate solution, dried over anhydrous magnesium sulfate, then filtered from the drying agent, and removed of the methylene chloride by distillation under reduced pressure to yield 2.4 g of a white powder readily soluble in organic solvents such as toluene, methyl ethyl ketone, ethyl acetate, and chloroform. It had a number-average molecular weight of 52,000, as determined by GPC. The NMR spectrum showed a broad absorption at δ0.8–3.0 with a peak at 1.5, more or less broad absorption at 2.8, 3.1, 3.8, 5.2, and 5.7, and a broad absorption at 6.0–7.6 with peaks at 6.6 and 7.1.

SYNTHESIS EXAMPLE 11

Into a 1-liter flask provided with a stirrer and thermometer and containing a methanol-toluene (20:80 by volume) mixture, was added 100 g of the copolymer obtained in Synthesis Example 10. To the resulting solution kept at 5° to 10° C., was added slowly 40 g of thiourea. The mixture was stirred for 72 hours. After completion of the reaction, the reaction mixture was filtered from the insolubles and poured into a large volume of methanol. A white precipitate which was formed was collected by filtration, washed with water, and dried to yield 58 g of a white solid substance having a number-average molecular weight of 78,000, as determined by GPC. From the NMR spectrum, the white solid substance was found to contain 42 and 45 mole-% of epoxy and thiiranyl groups, respectively. The NMR spectrum showed a broad absorption at δ-values 0.5–2.4 with a peak at 1.5, an absorption at 3.6–4.05 with peaks at 3.7 and 4.0, an absorption at 2.8–3.15, and an absorption at 6.0–7.6 with peaks at 6.5 and 7.0.

SYNTHESIS EXAMPLE 12

To a solution of 50 g of the copolymer obtained in synthesis Example 3 l in 300 ml of an acetone-cyclohexanone (2:1 by volume) mixture, was added slowly with stirring a solution of 13.6 g of periodic acid in 50 ml of water. When brown iodine had begun to precipitate, the mixture was heated to 60° C. and stirred for 2 hours. The reaction mixture was then poured slowly into a large volume of hexane. The white precipitate which was formed was collected by filtration and dried to yield 38 g of a white solid substance. From the proton NMR spectrum of this substance, it was found that 18.0% of the epoxy groups had been converted into 1,2-dihydroxyethyl groups.

To a solution of 10 g of the above white solid copolymer in 100 ml of tetrahydrofuran, was added 1.5 g of sodium hydride. The mixture was stirred at room temperature for 4 hours and filtered from the excess sodium hydride. To the filtrate cooled down to 5° C., was added gradually a solution of 7.0 g of triphenylchlorosilane in 100 ml of tetrahydrofuran. The mixture was stirred at room temperature for 2 hours. The reaction mixture was then poured slowly into a large volume of a methanol-water (80:20 by volume) mixture to precipitate a white solid. The precipitate was collected by filtration, washed with water, and dried to yield 7.2 g of a white solid copolymer having a number-average molecular weight of 38,000. The copolymer was found to contain 46 mole-% of epoxy groups, as determined from the NMR spectrum and 35 mole-% of triphenylsilyl groups, as determined by X-ray fluorescence analysis. The NMR spectrum showed an absorption at $\delta$-values 6.0–7.8 with peaks at 6.5 and 7.0 and a shoulder at 7.5, a broad absorption at 3.6–4.1, somewhat sharp-pointed absorption at 3.10 and 2.75, and a broad absorption at 0.5–2.4 with a peak at 1.5.

SYNTHESIS EXAMPLE 13

Into a 2-liter flask provided with a stirrer, dropping funnel, and thermometer, which had been flushed with nitrogen, were added 500 ml of dried tetrahydrofuran and 300 g of diisopropylamine. After the mixture had been cooled down to 0° C., to the flask was added dropwise with stirring 190 ml of a 15-% solution of n-butyllithium in hexane. To the mixture, while being maintained at 0° C., was added 40 g of styrene followed by the continuous addition of a solution of 60 g of p-divinylbenzene in 200 ml of tetrahydrofuran at a rate of 30 ml/hour. The mixture was further stirred for 8 hours under a nitrogen stream. After addition of 30 ml of methanol, the reaction mixture was slowly added to a large volume of methanol. A white precipitate which was formed was collected by filtration, washed with water, and dried to yield 52.0 g of a white solid which was readily soluble in acetone, ethyl acetate, toluene, and chloroform and had a number-average molecular weight of 12,000, as determined by GPC. The NMR spectrum showed a broad absorption at $\delta$-values 0.8–3.0 with a peak at 1.5, a somewhat sharp-pointed absorption at 5.0–5.3 and 5.5–5.8, and a broad absorption at 6.0–7.6 with peaks at 6.6 and 7.1. The relative intensity of absorption showed a divinylbenzene content of 68 mole-%.

Into a 100-ml reactor provided with a thermometer and a stirrer, were added 10 g of the compound obtained above, 100 ml of methylene chloride, and 0.9 g of sodium hydrogencarbonate. To the mixture which had been cooled down to 5° C., was added dropwise with stirring a solution of 1.8 g of m-chloroperbenzoic acid in 24 ml of methylene chloride. The mixture was stirred at 5° C. for 24 hours. After the disappearance of m-chloroperbenzoic acid had been confirmed with a potassium iodide-starch test-pater, the reaction mixture was washed three times with a saturated aqueous sodium hydrogencarbonate solution, dried over anhydrous magnesium sulfate, then filtered from the drying agent, and removed of the methylene chloride by distillation under reduced pressure to yield 8.0 g of a white powder readily soluble in organic solvents such as toluene, methyl ethyl ketone, ethyl acetate, and chloroform. The number-average molecular weight of the powder was 18,000, as determined by GPC.

A 5.0 g portion of the above white powder was dissolved in 100 ml of toluene. To the resulting solution, while being maintained at 5° to 10° C. was added 1.8 g of triphenylsilane followed by 0.2 g of Speier reagent. The mixture was stirred for 48 hours. The reaction mixture was subjected to after-treatment similarly to that described above to yield 3.8 g of a white powder having a number-average molecular weight of 21,000, as determined by GPC. The proton NMR spectrum showed an epoxy group content of 51 mole-% and the X-ray fluorescence analysis confirmed a triphenylsilyl group content of 16 mole-%. The NMR spectrum showed a broad absorption at $\delta$-values 0.5–2.8 with a peak at 1.5, a somewhat sharp-pointed absorptron at 3.75, 3.10, and 2.75, and an absorption at 6.0–7.8 with peaks at 6.5 and 7.0.

SYNTHESIS EXAMPLE 14

The reaction and after-treatment were carried out in the same manner as in Synthesis Example 3, except that 30 g of 3-vinylstyrene oxide as the epoxy compound and 70 g of styrene were used. There were obtained 78 g of a copolymer having a number-average molecular weight of 18,000, as determined by GPC. The proton NMR spectrum showed an epoxy group content of 25 mole-%. The NMR spectrum was very similar to that of a copolymer obtained in Synthesis Example 3.

SYNTHESIS EXAMPLE 15

The procedure of Synthesis Example 10 was repeated, except that a commercial divinylbenzene (56% by weight; the ratio of m-form to p-form =75 : 25) was used in place of the p-divinylbenzene. There was obtained a copolymer having a number-average molecular weight of 36,000, as determined by GPC. The NMR spectrum was very similar to that of a copolymer obtained in Synthesis Example 3 and showed a divinylbenzene content of 80 mole-%.

SYNTHESIS EXAMPLE 16

Into a 1-liter separable flask provided with a stirrer, thermometer, and reflux condenser and containing 400 ml of purified toluene, were added with stirring 40 g of the thiiranyl compound obtained in Synthesis Example 2 - 1 and 60 g of styrene followed by 1 g of $\alpha$, $\alpha'$-azobisisobutyronitrile. The mixture was stirred at 70° for 7 hours under a nitrogen stream. After completion of the reaction, the reaction mixture was poured into a large volume of methanol and left standing overnight. A white precipitate which was formed was collected by filtration, washed with methanol, and dried at room temperature under reduced pressure to yield 68 g of a copolymer having a number-average molecular weight of 26,000, as determined by GPC. The proton NMR spectrum of the copolymer showed a thiiranyl compound content of 38 mole-%.

SYNTHESIS EXAMPLES 17 to 20

Copolymers were obtained in the same manner as in Synthesis Example 16, except that monomers shown in Table 2 were used in place of the styrene.

TABLE 1

| Synth. Example No. | Ro | X | Y | Z | A/B | A mole % | Number-average mol. wt. |
|---|---|---|---|---|---|---|---|
| 3 | E | H, | H, | phenyl | 50/50 | 56 | 23,000 |
| 4 | E | phenyl, | H | phenyl | 50/50 | 80 | 14,000 |
| 5 | E | H, | H, | —Si(C$_6$H$_5$)$_3$ | 80/20 | 91 | 38,000 |
| 6 | E | H, | H, | 2-naphthyl | 20/80 | 10 | 85,000 |
| 7 | E | H, | —CH$_3$, | —COO—Si(C$_6$H$_5$)$_3$ | 85/15 | 94 | 48,000 |
| 8 | E | H, | H, | 9-anthryl | 50/50 | 60 | 31,000 |
| 9 | E | H, | H, | pyrido-indolyl | 10/90 | 7 | 110,000 |
| 16 | S | H, | H, | phenyl | 40/60 | 38 | 26,000 |
| 17 | S | H, | H, | carbazolyl | 50/50 | 67 | 16,000 |
| 18 | S | H, | phenyl, | phenyl | 40/60 | 82 | 18,000 |
| 19 | S | phenyl, | CH$_3$, | phenyl | 50/50 | 78 | 12,000 |

TABLE 1-continued

| Synth. Example No. | Ro | X, | Y, | Z | A/B | A mole % | Number-average mol. wt. |
|---|---|---|---|---|---|---|---|
| 20 | S | | — | | — | 100 | 8,000 |

Note:
Ro: A substituent group of the monomer [A], that is, epoxy group (E) of thiiranyl group (S).

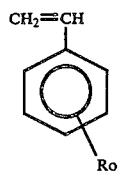

[A]

X, Y, Z: Substituent groups of the monomer [B].

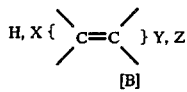

[B]

A/B: Weight ratio of charged monomer [A] to charged monomer [B].
A mole %: Structural unit A content of copolymer.

TABLE 2

| Synthesis Example No. | δ-value (ppm) |
|---|---|
| 3 | 6.0–7.6 (m, 6.5 p, 7.05 p) |
|   | 3.75 (br.s), 3.10 (br.s), 2.75 (br.s) |
|   | 0.5–2.2 (m, 1.5 p) |
| 4 | 6.0–7.6 (m, 6.5 p, 7.05 p) |
|   | 3.76 (br.s), 3.10 (br.s), 2.75 (br.s) |
|   | 0.5–2.2 (m, 1.5 p) |
| 5 | 6.0–7.8 (m, 7.5 shr, 7.1 p, 6.5 p) |
|   | 3.75 (br.s), 3.10 (br.s), 2.75 (br.s) |
|   | 0.5–2.4 (m, 1.5 p) |
| 6 | 6.0–8.0 (m, 7.8 shr, 7.2 p, 7.0 p, 6.5 p) |
|   | 3.75 (br.s), 3.10 (br.s), 2.75 (br.s) |
|   | 0.5–2.4 (m, 1.5 p) |
| 7 | 6.0–7.8 (m, 7.6 shr, 7.0 p, 6.5 p) |
|   | 3.75 (br.s), 3.10 (br.s), 2.75 (br.s) |
|   | 0.5–2.4 (m, 1.3 p, 1.5 p) |
| 8 | 8.6 (br.s), 7.95 (br.s) |
|   | 6.0–7.8 (m, 6.5 p, 7.0 p) |
|   | 3.75 (br.s), 3.10 (br.s), 2.75 (br.s) |
|   | 0.5–2.6 (m, 1.5 p) |
| 9 | 8.98 (br.s), 8.4 (br.p), 8.25 (br.p) |
|   | 6.0–7.9 (m, 7.6 p, 7.0 p, 6.5 p) |
|   | 3.75 (br.s), 3.10 (br.s), 2.25 (br.s) |
|   | 0.5–2.6 (m, 1.5 p) |
| 16 | 6.2–7.5 (m, 6.5 p, 7.0 p) |
|   | 3.9–4.2 (br.s, 4.0 p) |
|   | 2.8–3.05 (m, 2.95 p) |
|   | 0.8–2.2 (m, 1.56 p) |
| 17 | 8.0–8.4 (m, 8.05 p, 8.15 p) |
|   | 6.0–7.6 (m, 6.5 p, 7.0 p) |
|   | 4.0 (br.s), 2.8–8.1 (m, 2.95 p) |
|   | 0.8–2.2 (m, 1.5 p) |
| 18 | 6.0–7.6 (m, 6.5 p, 7.0 p) |
|   | 3.9–4.2 (br.s, 4.0 p) |
|   | 2.8–3.1 (m, 2.95 p) |
|   | 0.8–2.4 (m, 1.5 p) |
| 19 | 6.0–7.6 (m, 6.5 p, 7.0 p) |
|   | 3.9–4.2 (br.s, 4.0 p) |
|   | 2.8–3.1 (m, 2.95 p) |
|   | 0.6–2.2 (m, 1.5 p, 1.2 shr) |
| 20 | 6.0–7.6 (m, 6.5 p, 7.0 p) |
|   | 4.0 (br.s), 2.8–3.1 (m, 2.95 p) |
|   | 0.8–2.2 (m, 1.5 p) | br: Broad absorption.
m: Broad absorption in the form of an assemblage of a large number of peaks.
p: Peak.
s: Single absorption.
shr: Shoulder of absorption curve.

EXAMPLES 1 to 17

Copolymers obtained in Synthesis Examples 3 to 19 were dissolved in coating solvents shown in Table 3 to obtain resist coating compositions. Each coating composition was applied to a silicon wafer by spin coating to form a resist layer of 1 μm in thickness. The coated wafer was prebaked under the conditions shown in Table 3. The patterning was performed by means of an electron beam patterning instrument (accelerating voltage was 20 KV). After the exposure, each wafer was developed by dipping for 90 seconds in each prescribed developer (Table 3).

To evaluate the dry etching resistance, each wafer was etched in a parallel plate etching apparatus using as etchant a $CF_4$—$O_2$ (95:5) by volume) mixture gas under the conditions: 1 Torr., 0.3 W/cm$^2$, 5 minutes. After etching, the decrease in thickness of resist coating was measured. The results obtained were as shown in Table 3.

COMPARATIVE EXAMPLE 1

A polyglycidyl methacrylate (number-average molecular weight: 46,000) was prepared by common radical polymerization and the electron beam sensitivity and the dry etching resistance were evaluated as in Example 1. As shown in Table 3, the dry etching resistance was far inferior to that of the material of this invention.

TABLE 3

| Example No. | Polymer Synth. Ex. No. | Coating solvent | Drying temp. (°C.) and time (min.) | Developer | Sensitivity (μc/cm$^2$) | Relative rate of etching |
|---|---|---|---|---|---|---|
| 1 | 3 | ECAC | 60° × 30 | THF | 1.0 | 34 |
| 2 | 4 | " | " | Cyclohexanone | 0.8 | 32 |

TABLE 3-continued

| Example No. | Polymer Synth. Ex. No. | Coating solvent | Drying temp. (°C.) and time (min.) | Developer | Sensitivity ($\mu c/cm^2$) | Relative rate of etching |
|---|---|---|---|---|---|---|
| 3 | 5 | " | 80° × 15 | Cyclohexanone | 0.7 | 16 |
| 4 | 6 | Toluene | 90° × 10 | Acetone | 2.4 | 27 |
| 5 | 7 | ECAC/EC (80/20) | 90° × 15 | n-Amyl acetate | 0.6 | 21 |
| 6 | 8 | Toluene | 60° × 20 | Cyclohexanone | 0.9 | 30 |
| 7 | 9 | " | " | Cyclohexanone | 2.7 | 19 |
| 8 | 10 | ECAC | 80° × 15 | Cyclohexanone | 0.96 | 36 |
| 9 | 11 | " | " | Cyclohexanone/EC (95/5) | 0.15 | 38 |
| 10 | 12 | ECAC | 80° × 15 | MEK/MIBK (60/40) | 1.6 | 10 |
| 11 | 13 | " | 90° × 15 | MEK/MIBK (60/40) | 2.3 | 9 |
| 12 | 14 | Toluene | " | MIBK | 8 | 32 |
| 13 | 15 | " | 60° × 20 | Cyclohexanone | 0.25 | 40 |
| 14 | 16 | ECAC | 80° × 15 | Cyclohexanone | 2.3 | 34 |
| 15 | 17 | NMP | 90° × 30 | MEK | 1.25 | 30 |
| 16 | 18 | Toluene | 60° × 20 | " | 0.7 | 35 |
| 17 | 19 | ECAC | 90° × 10 | MEK/EC (60/40) | 0.75 | 45 |
| Comp. Ex. 1 | — | " | 80° × 15 | MIBK | 6.0 | 100 |

Note:
Relative rate of etching: a relative value obtained by assuming the rate of etching of polyglycidyl methacrylate prepared in Comparative Example 1 to be 100.
ECAC: Ethyl "Cellosolve" acetate.
EC: Ethyl "Cellosolve".
NMP: N—methyl-γ-pyrrolidone.
MIBK: Methyl isobutyl ketone.

EXAMPLE 18

Test for heat resistance.

Using a copolymer obtained in Synthesis Example 3, a pattern of 0.2 $\mu$m/1.2 $\mu$m (line/space) was formed and heated at 250° C. for 30 minutes. There was observed no deformation of the pattern, indicating satisfactory heat resistance.

COMPARATIVE EXAMPLE 2

A commercial polystyrene was chloromethylated with chloromethyl methyl ether to prepare a styrene-chloromethylstyrene copolymer having a number-average molecular weight of 110,000. The copolymer was tested for heat resistance in a manner similar to that in Example 18. The flow of pattern was so marked that the space portions disappeared.

EXAMPLE 19

Adhesion test.

Using the copolymer obtained in Synthesis Example 3, 30×30 patterns of each 5 $\mu$m square in size were formed in a manner similar to that in Example 1. These patterns were subjected to supersonic vibration for 30 minutes in a developer. Entirely no lifting of the pattern was observed.

COMPARATIVE EXAMPLE 3

Using the copolymer obtained in Comparative Example 2, adhesion test was conducted as in Example 19. The incidence of adhesion failure was 2% (5 minutes) and 50% (30 minutes).

EXAMPLE 20

To 130 parts of toluene, were added 100 parts of the copolymer prepared in Synthsis Example 3, 10 parts of benzophenone, and 1 part of 4,4'-bis(dimethylamino)-benzophenone. The mixture was thoroughly mixed to become homogeneous. The homogeneous mixture was coated by a blade coater on an aluminum foil and dried at 50° C. for 20 minutes to leave behind a thin layer of 5 $\mu$ in thickness. The foil was superposed with a pattern film carrying parallel lines, each 10 $\mu$ in width, at an interval of 10 $\mu$, and was given an exposure of 200 mJ/cm² of ultraviolet rays from a superhigh pressure mercury lamp. After the exposure, the foil was developed in cyclohexanone for 30 seconds to obtain a sharp pattern.

EXAMPLE 21

To 300 parts of ethyl cellosolve acetate, were added 100 parts of the copolymer obtained in Synthesis Example 4 and 8 parts of hexaphenylcyclotrisiloxane. The mixture was thoroughly mixed until a homogeneous coating composition was obtained. The coating composition was tested for the electron beam sensitiviety and dry etching resistance in the same manner as in Example 1. The sensitivity was 0.8 $\mu c/cm^2$ and the relative rate of etching was 12, indicative of the excellent resistance.

SYNTHESIS EXAMPLE 21

Into a 1-liter separable flask provided with a stirrer, thermometer, and reflux condenser, were added 300 ml of purified methyl ethyl ketone, 10 g of the epoxy compound obtained in Synthesis Example 1-1, and 90 g of phenyl methacrylate, then followed by 1 g of α,α'-azobisisobutyronitrile. While being maintained at 70° C., the mixture was stirred for 7 hours under a nitrogen stream. After completion of the reaction, the reaction mixture was poured into a large volume of methanol and left standing overnight. The white precipitate which was formed was collected by filtration, washed with methanol, and dried at room temperature under reduced pressure to yield 62 g of a copolymer having a number-average molecular weight of 45,000, as determined by GPC. The proton NMR spectrum showed signals at δ-values 6.8–7.6 (phenyl proton), 3.75

(epoxy group, —CH— proton), 3.10, 2.75 (epoxy group, >CH$_2$ proton), 0.2–2.2

(main chain, —CH$_2$—, —CH, —C—CH$_3$ proton).

From the integrated intensity ratio between thiiranyl proton and phenyl proton, the episulfide compound content was found to be 8 mole-%.

SYNTHESIS EXAMPLE 22

The procedure of Synthesis Example 21 including the copolymerization and after treatment was repeated, except that phenyl isopropenyl ketone was used in place of the phenyl methacrylate and the thiiranyl compound obtained in Synthesis Example 2-1 was used. There were obtained 46 g of a copolymer having a number-average molecular weight of 12,000. The proton NMR spectrum showed signals at δ-values 6.8–8.2 with peaks at 7.40 and 7.80 (phenyl proton), 3.9–4.1 (thiiranyl group, >CH-proton), 2.8–3.95 (thiiranyl group, >CH$_2$ proton), and 0.4–2.2 with a peak at 1.0 (main chain, —CH$_2$—, >CH- proton). The thiiranyl compound content was 12 mole-%.

EXAMPLE 22 and 23

Copolymers obtained in Synthesis Examples 20 and 21 were each uniformly dissolved in ethyl "Cellosolve" acetate. The resulting solution was applied to a silicon wafer by spin coating to form a resist layer of 0.6 μm in thickness. The coated wafer was baked at 180° C. for 30 minutes to expel the solvent. Patterning was performed by means of an electron beam patterning apparatus (accelerating voltage: 20 kV). Th wafer carrying the pattern was immersed in cyclohexanone for 15 minutes to obtain a faultless positive-type pattern. The test result were as shown in Table 4.

COMPARATIVE EXAMPLE 4

A pattern was scribed in the same manner as in Example 22, except that a commercial polymethyl methacrylate having a molecular weight of 160,000 and a methyl ethyl keton developer were used. The sensitivity was found to be insufficient and the fine lines in the reproduced image were meandering.

COMPARATIVE EXAMPLE 5

Into a 2-liter flask provided with a stirrer, dropping funnel, and thermometer, which had been flushed with nitrogen, were placed 500 ml of dried tetrahydrofuran and 200 g of diisopropylamine. To the mixture cooled down to 0° C., was added dropwise with stirring 190 ml of a 15-% solution of n-butyllithium in hexane. To the resulting mixture, while being maintained at 0° C., was added 35 g of styrene followed by the continuous addition, at a rate of 30 ml/hour, of 200 ml of tetrahydrofuran solution containing 65 g of p-divinylbenzene. The mixture was further stirred for 8 hours under a nitrogen stream. After addition of 30 ml of methanol, the reaction mixture was slowly poured into a large volume of methanol. A white precipitate which was formed was collected by filtration, washed with water, and dried to yield 83 g of a white solid substance which was readily soluble in acetone, ethyl acetate, toluene, chloroform and had a number-average molecular weight of 48,000, as determined by GPC. The NMR spectrum showed a broad absorption at δ-values 0.8–3.0 with a peak at 1.5, somewhat sharp-pointed absorption at 5.0–5.3 and 5.5–5.8, and a broad absorption at 6.0–7.6 with peaks at 6.6 and 7.1. From the relative intensities of the absorption, this substance was found to contain 84 mole-% of divinylbenzene.

Into a 100-ml reactor provided with a thermometer and stirrer, were placed 26 g of the compound obtained above, 30 ml of methylene chloride, and 3.6 g of sodium hydrogencarbonate. To the mixture cooled down to 5° C. and stirred, was added dropwise a solution of 1.0 g of m-chloroperbenzoic acid in 24 ml of methylene chloride. While being maintained at 5° C., the mixture was stirred for 8 hours. After the disappearance of m-chloroperbenzoic acid had been confirmed with potassium iodide-starch test paper, the reaction mixture was washed three times with a saturated sodium hydrogencarbonate solution and dried over anhydrous magnesium sulfate. After removal of the drying agent by filtration, the reaction mixture was stripped of the methylene chloride by distillation under reduced pressure to yield 2.4 g of a white powder which was readily soluble in organic solvent such as toluene, methyl ethyl keton, ethyl acetate, and chloroform and had a number-average molecular weight of 52,000, as determined by GPC. From NMR spectrum, this substance was found to contain 20 mole-% of epoxy group and 64 mole-% of vinyl group.

A coating composition was prepared by dissolving the copolymer obtained above in toluene to form a uniform solution. The coating composition was applied to a silicon substrate by spin coating, and heated at 80° C. for 15 minutes. A pattern was scribed on the coated substrate in a manner similar to that in Example 1 and developed in n-amyl acetate. It was found that the pattern had been unsatisfactorily scribed because of the surface hardening which had taken place during the heat treatment owing to insufficient thermal stability of the copolymer.

TABLE 4

| Polymer | Developer | Electron beam sensitivity (μc/cm$^2$) | Relative rate of etching |
|---|---|---|---|
| Synth. Example 20 | Cyclohexanone | 0.9 | 60 |
| Synth. Example 21 | Cyclohexanone | 0.8 | 64 |
| Comp. Example 4 | Methyl ethyl ketone | 200 | 110 |

As shown above, the image-forming material of the present invention has a high sensitivity to high-energy beams and is excellent in dry etching resistance, heat stability, and resolution. The present invention, therefore, is able to provide an image-forming material superior to conventional ones.

What is claimed is:

1. An image-forming material sensitive to high-energy beams selected from the group consisting of ultraviolet rays, deep ultraviolet rays, gamma-rays, X-rays and electron beams, comprising:
  a substrate suitable for a resist layer selected from the group consisting of an aluminum foil and a silicon substrate; and
  a resist layer disposed on said substrate containing a copolymer consisting of from 1 to 99 mole-% of recurring structural units selected from the group consisting of A and A' and mixtures thereof and 1 to 99 mole-% of recurring structural units selected from the group consisting of B and mixtures thereof having a number-average molecular weight of 500 to 1,000,000:

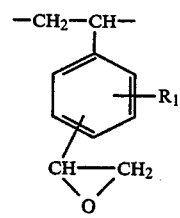 [A]

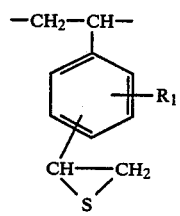 [A']

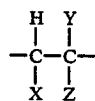 [B]

wherein,
  $R_1$ of the formulas A and A' represents a hydrogen atom, halogen atom, or an alkyl group having 1 to 6 carbon atoms, said substituent groups $R_1$, epoxy group, and thiiranyl group being attached to the position ortho, meta, or para to the carbon atom in the main chain;
  X, Y, and Z of the formula B represent each a hydrogen atom, halogen atom, cyano group, alkyl group having 1 to 6 carbon atoms, halogenated alkyl group having 1 to 6 carbon atoms, aryl group having 6 to 30 carbon atoms and bearing a substituent alkyl or halogenated alkyl group having 1 to 6 carbon atoms, aryl group having 6 to 30 carbon atoms, —$COOR_2$, —$COR_2$, —O—$COR_2$ (wherein $R_2$ represents an alkyl or halogenated alkyl group having 1 to 12 carbon atoms, aryl group having 6 to 30 carbon atom, and bearing a substituent alkyl or halogenated alkyl group having 1 to 6 carbon atoms, or aryl group having 6 to 30 carbon atoms), nitro group, substituent group containing a hetero ring bearing substituent $R_3$ ($R_3$ represents a hydrogen atom, hydroxyl group, carboxyl group, halogen atom, nitro group, amino group, cyano group, alkyl or halogenated alkyl group having 1 to 6 carbon atoms, or aryl group having 6 to 10 carbon atoms), or substituent group containing a silicon atom.

2. The image-forming material according to claim 1, wherein $R_1$ is a hydrogen atom.

3. The image-forming material according to claim 1, wherein the epoxy group and the thiiranyl group are each at the position meta or para to the carbon atom of main chain.

4. The image-forming material according to claim 3, wherein the epoxy group and the thiiranyl group are each at the position para to the carbon atom of main chain.

5. The image-forming material according to claim 2, wherein X is a hydrogen atom, phenyl group or naphthyl group.

6. The image-forming material according to claim 2, wherein Y is a hydrogen atom, halogen atom, cyano group, alkyl group having 1 to 6 carbon atoms, halogenated alkyl group having 1 to 6 carbon atoms, aryl group having 6 to 30 carbon atoms and bearing a substituent alkyl or halogenated alkyl group having 1 to 6 carbon atoms, or aryl group having 6 to 30 carbon atoms.

7. The image-forming material according to claim 2, wherein Y is a hydrogen atom.

8. The image-forming material according to claim 2, wherein Y is an aryl group having 6 to 30 carbon atoms.

9. The image-forming material according to claim 2, wherein Z is an aryl group having 6 to 30 carbon atoms and bearing a substituent alkyl or halogenated alkyl group having 1 to 6 carbon atoms, an aryl group having 6 to 30 carbon atoms, a substituent group containing a hetero ring, the hetero atom of which being nitrogen atom, or a substituent group containing a silicon atom.

10. The image-forming material according to claim 2, wherein X and Y are each hydrogen atom and Z is a phenyl group, naphthyl group, or anthranyl group.

11. The image-forming material according to claim 2, wherein X and Y are each a hydrogen atom and Z is a 9-carbazolyl group, 9-carbolinyl group, or 1-indolyl group.

12. The image-forming material according to claim 2, wherein X and Y are each a hydrogen atom and Z is a tri-phenylsilyl group, triphenylsilyloxycarbonyl group, 4-(1,2-ditriphenylsilyloxyethyl)phenyl group, or 4-(2-triphenylsilylethyl)phenyl group.

13. The image-forming material according to claim 2, wherein X is a hydrogen atom and Y and Z are each a phenyl group, naphthyl group, or phenanthryl group.

14. The image-forming material according to claim 2, wherein X is a methyl group and Y and Z are each a phenyl group, naphthyl group, or phenanthryl group.

15. The image-forming material according to claim 1, wherein the mole percentage of the sum of recurring units of formulas [A] and [A'] is 5 to 95 and the mole percentage of the recurring unit of formula [B] is 5 to 95.

16. The image-forming material according to claim 15, wherein the mole percentage of the sum of recurring units of formulas [A] and [A'] is 10 to 90 and the mole percentage of the recurring unit of formula is 10 to 90.

17. The image-forming material according to claim 1, wherein the number-average molecular weight is 3,000 to 1,000,000.

18. The image-forming material according to claim 17, wherein the number-average molecular weight is 3,000 to 500,000.

19. The image-forming material according to claim 1 which further contains 0.5 to 20 parts by weight of a photoionization polymerization initiator based on 100 parts by weight of the material.

20. The image-forming material according to claim 1 wherein the copolymer consists essentially of the recurring structural unit represented by the formula [A] and at least one of the recurring unit represented by the formula [B].

21. The image-forming material according to claim 1 wherein the copolymer consists essentially of the recurring unit represented by the formula [A'] and at least one of the recurring unit represented by the formula [B].

22. The image-forming element comprising a substrate having coated thereon a layer comprising the image-forming material as described in claim 1.

23. The image-forming material according to claim 1, wherein:
   $R_1$ is an alkyl group selected from the group consisting of methyl, ethyl, propyl, butyl, pentyl, hexyl, and 2-methylbutyl groups, or a halogen atom selected from the group consisting of fluorine, chlorine, bromine, and iodine; or
   X, Y and Z each are halogen atoms selected from the group consisting of fluorine, chlorine, bromine, and iodine; alkyl groups selected from the group consisting of methyl, ethyl, propyl, butyl, pentyl, hexyl, isopropyl, isobutyl, sec-butyl, tert-butyl, neopentyl, tert-pentyl, and isohexyl; halogenated alkyl groups selected from the group consisting of chloromethyl, trichloromethyl, trifluoromethyl, 1,1,1-trichloroethyl, 1-trifluoromethylpentyl, 2,2,2-trifluoroethyl, trifluoroisopropyl, hexafluorobutyl, and heptafluorobutyl; substituted aryl groups selected from the group consisting of substituted phenyl, substituted indenyl, substituted naphthyl, substituted azulenyl, substituted heptalenyl, substituted biphenylenyl, substituted as-indacenyl, substituted s-indacenyl, substituted acenaphthenyl, substituted fluoroenyl, substituted phenanthryl, substituted anthryl, substituted fluoranthryl, substituted aceanthrylenyl, substituted triphenylenyl, substituted pyrenyl, substituted chrysenyl, substituted naphthacenyl, substituted picenyl, substituted perylenyl, substituted pentaphenyl, substituted pentacenyl, substituted tetraphenylenyl, substituted hexaphenyl, substituted rubicenyl, substituted coronenyl, substituted trinaphthylenyl, substituted heptaphenyl, substituted heptacenyl, and substituted pyranthrenyl; or —COOR$_2$, —COR$_2$, and —O—COR$_2$ selected from the group consisting of —COOCH$_3$, —COOC$_2$H$_5$, —COOCC$_{13}$, —COOCH$_2$.CC$_{13}$, —COOCHF.CHF.CHFCF$_3$, —COOC$_6$H$_5$, —COOC$_{10}$H$_7$, —COCH$_3$, —COCF$_3$, —COC$_6$H$_5$, —O—COCH$_3$, —O—COCC$_{13}$, —O—COCF$_3$, —O—COC$_6$H$_5$, —O—COC$_{10}$H$_7$, —O—COC$_4$H$_9$, and —O—COC$_6$H$_{13}$.

24. The image-forming material according to claim 1, wherein the proportions of each of A and A' are determined by the formula $1 \leq M_A + M_{A'} \leq 99$ $0 \leq M_A \leq 99$ $0 \leq M_{A'} \leq 99$ wherein $M_A$ and $M_{A'}$ represent mole-% of A and A' respectively.

25. The image-forming material according to claim 1, wherein the monomers of formula B are selected from the group consisting of styrene, 1-vinylnaphthalene, 2-vinylnaphthalene, 1-vinylanthracene, 2-vinylanthracene, 9-vinylanthracene, 2-vinylphenanthrene, 3-vinylphenanthrene, 3-chloromethylstyrene, 4-chloromethylstyrene, 3-fluoromethylstyrene, 4-fluoromethylstyrene, N-vinylpyrrole, N-vinylisoindole, N-vinylindole, N-vinylcarbazole, 3-vinylphenathridine, 2-vinylacridine, 4-trimethylsilylstyrene, 4-triphenylsilylstyrene, dimethylphenylvinylsilane, diphenylmethylvinylsilane, triphenylvinylsilane, 4-(2-triphenylsilylethyl)styrene, 4-(1,2-ditriphenylsilyloxyethyl)styrene, 1,1-diphenylethylene, 1-(2-naphthyl)-1-phenylethyelne, 1-(1-naphthyl)-1-phenylethylene, 1-methyl-1-phenylethylene, 1-(9-carbazolyl)-1-phenylethylene, 1-(9-carbazolyl)-1-methylethylene, 1-(1-indolyl)-1-phenylethylene, 1-methyl(4-triphenylsilylphenyl)ethylene, 1-phenyl(4-triphenylsilylsilylphenyl)ethylene, 2-methyl-1-phenylethylene, 1,2-diphenylethylene, 2-(2-naphthyl)-1-phenylethylene, 2-(1-naphthyl)-1-phenylethylene, 1-(9-anthracenyl)-1-phenylethylene, 1-(2-phenanthryl)-2-phenylethylene, 2-(1-naphthyl)-1-(2-phenanthryl)ethylene, 1,2,-diphenyl-2-methylethylene, 2-(1-naphthyl)-1-methyl-1-phenylethylene, 1,1,2-triphenylethylene, and 2-(2-naphthyl)1,1-diphenylethylene.

26. The image-forming material according to claim 19, wherein the photoionization polymerization initiator is selected from the, group consisting of 4-diazodiphenylamine sulfate, 4-diazo-4'-methoxydiphenylamine sulfate, 4-diazodiphenylamine hydrochloride, diphenyliodonium hexafluoroarsenate, bis(4-tert-butylphenyl)iodonium hexafluorophosphate, triphenylsulfonium hexafluoroarsenate, triphenylpyrylium perchlorate, 4-methoxyphenyl-2,6-diphenylpyrylium perchlorate, triphenylthiopyrylium perchlorate, and triphenylthiopyrylium tetrafluoroborate.

27. The image-forming material according to claim 1, wherein the substituted phenyl groups are 4-methylphenyl group, 3-ethylphenyl group or 4-chloromethylphenyl.

28. The image-forming material according to claim 1, wherein the hetero ring bearing substituent R$_3$ is selected from the group consisting of formulas 1 to 31:

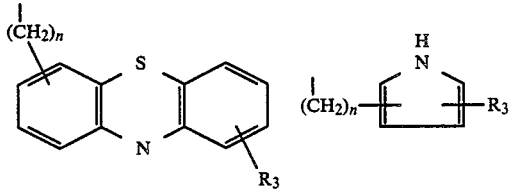

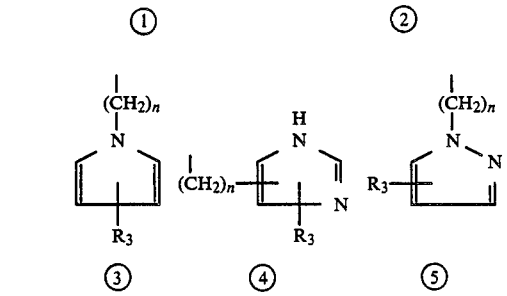

-continued
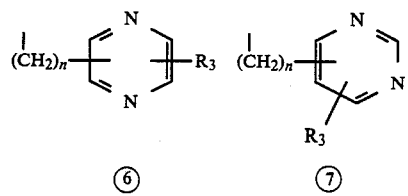
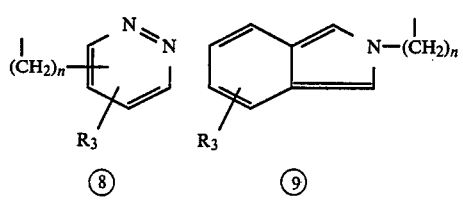
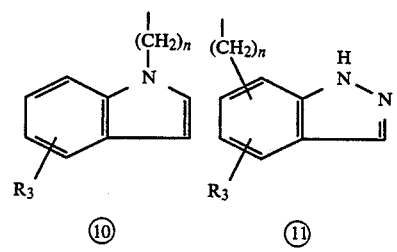
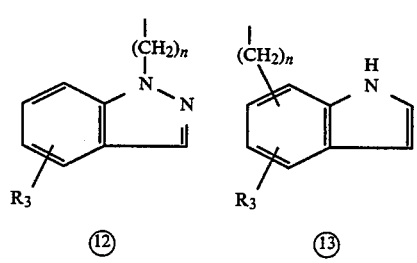
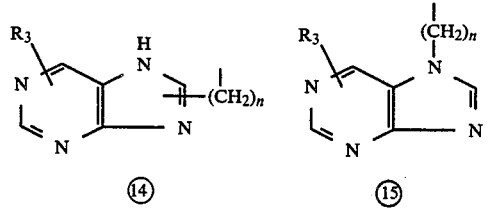
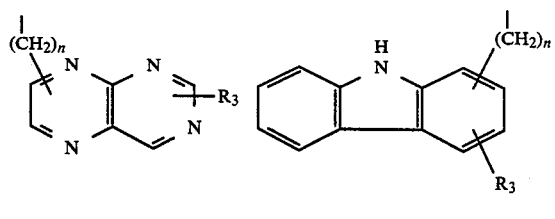
-continued
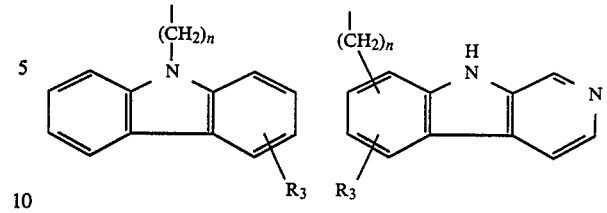
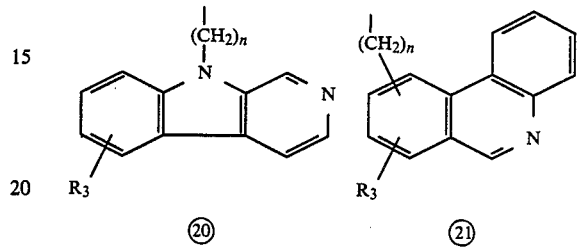
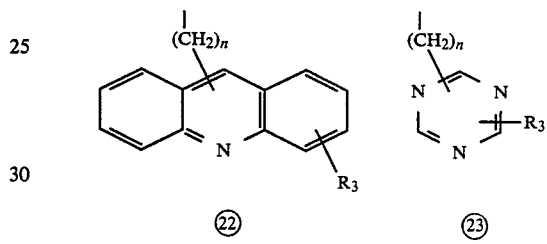
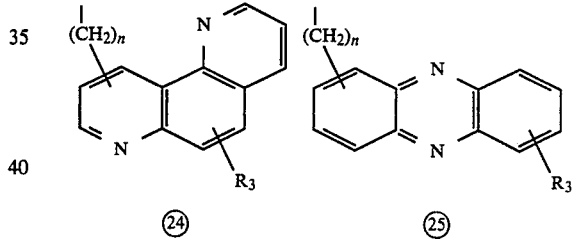
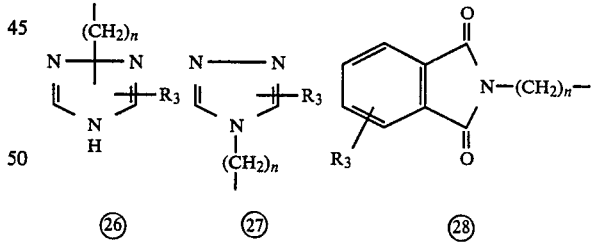
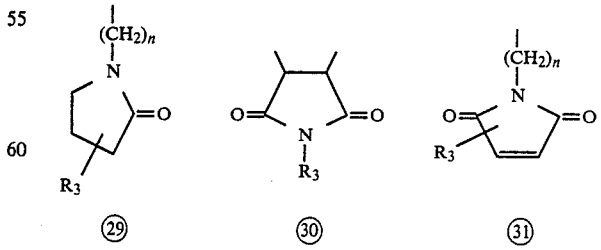
29. The image-forming material according to claim 1, wherein a substituent group containing a silicon atom is selected from the group consisting of formulas 32 to 46:

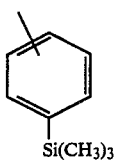 (32)
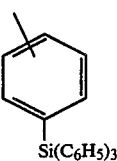 (33)
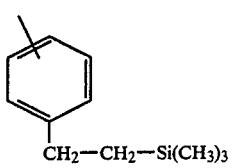 (34)
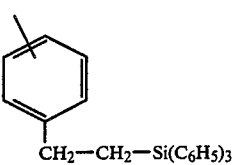 (35)
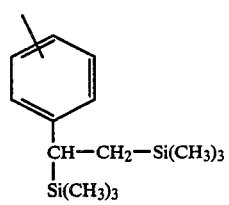 (36)
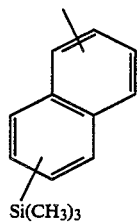 (37)
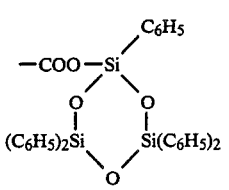 (38)
—COOSi$(C_6H_5)_3$  (39)
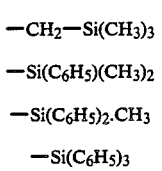 (40)
—Si$(CH_3)_3$  (41)
—O—Si$(CH_3)_3$  (42)
—$CH_2$—Si$(CH_3)_3$  (43)
—Si$(C_6H_5)(CH_3)_2$  (44)
—Si$(C_6H_5)_2 \cdot CH_3$  (45)
—Si$(C_6H_5)_3$  (46)
30. The image-forming material according to claim 1, which consists of said units A and B.
31. The image-forming material according to claim 1, which consists of said units A' and B.
32. The image-forming material according to claim 1, wherein the silicon substrate is a silicon wafer.
* * * * *